(12) United States Patent
Balasubramanian et al.

(10) Patent No.: US 9,195,610 B2
(45) Date of Patent: Nov. 24, 2015

(54) TRANSACTION INFO BYPASS FOR NODES COUPLED TO AN INTERCONNECT FABRIC

(75) Inventors: Dheera Balasubramanian, Richardson, TX (US); Raguram Damodaran, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1098 days.

(21) Appl. No.: 13/241,175

(22) Filed: Sep. 22, 2011

(65) Prior Publication Data

US 2012/0079203 A1 Mar. 29, 2012

Related U.S. Application Data

(60) Provisional application No. 61/387,283, filed on Sep. 28, 2010.

(51) Int. Cl.
*G06F 12/12* (2006.01)
*G06F 7/483* (2006.01)
(Continued)

(52) U.S. Cl.
CPC .............. *G06F 12/12* (2013.01); *G06F 1/3296* (2013.01); *G06F 7/483* (2013.01); *G06F 9/3012* (2013.01); *G06F 11/1064* (2013.01); *G06F 12/0246* (2013.01); *G06F 13/1605* (2013.01); *G06F 13/18* (2013.01); *H03K 19/0016* (2013.01); *H03K 21/00* (2013.01); *H03M 13/2903* (2013.01); *H03M 13/353* (2013.01); *G06F 13/1652* (2013.01); *G06F 13/1657* (2013.01); *G06F 13/1663* (2013.01); *G06F 13/364* (2013.01); *G06F 2212/1032* (2013.01); *G06F 2212/221* (2013.01); *G06F 2212/69* (2013.01); *Y02B 60/1214* (2013.01); *Y02B 60/1285* (2013.01); *Y02B 60/32* (2013.01)

(58) Field of Classification Search
CPC ..... G06F 13/4022; G06F 13/14; G06F 12/08;
G06F 12/00; G06F 12/12; G06F 13/18;
G06F 13/1605; G06F 11/1064; G06F 9/3012;
G06F 12/0246; G06F 7/483; G06F 1/3296;
G06F 2212/69; G06F 2212/1032; G06F
2212/221; G06F 13/1663; H03M 13/2903;
H03M 13/353; H03K 21/00; H03K 19/0016
See application file for complete search history.

(56) References Cited

U.S. PATENT DOCUMENTS

2003/0041163 A1* 2/2003 Rhoades et al. ............... 709/232
2003/0095557 A1* 5/2003 Keller et al. .................. 370/412
(Continued)

OTHER PUBLICATIONS

"TMS320C6678 Multicore Fixed and Floating-Point Digital Signal Processor", Data Manual, SPRS691, Texas Instruments Incorporated, Nov. 2010, pp. 1-259.

*Primary Examiner* — Michael Alsip
(74) *Attorney, Agent, or Firm* — Robert D. Marshall, Jr.; Frank D. Cimino

(57) ABSTRACT

A shared resource within a module may be accessed by a request from an external requester. An external transaction request may be received from an external requester outside the module for access to the shared resource that includes control information, not all of which is needed to access the shared resource. The external transaction request may be modified to form a modified request by removing a portion of the locally unneeded control information and storing the unneeded portion of control information as an entry in a bypass buffer. A reply received from the shared resource may be modified by appending the stored portion of control information from the entry in the bypass buffer before sending the modified reply to the external requester.

28 Claims, 12 Drawing Sheets

(51) Int. Cl.

| | |
|---|---|
| *G06F 9/30* | (2006.01) |
| *G06F 11/10* | (2006.01) |
| *G06F 13/16* | (2006.01) |
| *G06F 13/18* | (2006.01) |
| *G06F 1/32* | (2006.01) |
| *G06F 12/02* | (2006.01) |
| *G06F 13/364* | (2006.01) |
| *H03M 13/35* | (2006.01) |
| *H03M 13/29* | (2006.01) |
| *H03K 19/00* | (2006.01) |
| *H03K 21/00* | (2006.01) |

(56) References Cited

U.S. PATENT DOCUMENTS

| | | | |
|---|---|---|---|
| 2005/0021871 A1* | 1/2005 | Georgiou et al. | 709/250 |
| 2010/0191911 A1* | 7/2010 | Heddes et al. | 711/118 |
| 2012/0207165 A1* | 8/2012 | Davis | 370/392 |

* cited by examiner

COMMAND INTERFACE TRANSFER

WRITE DATA INTERFACE BURST TRANSFERS

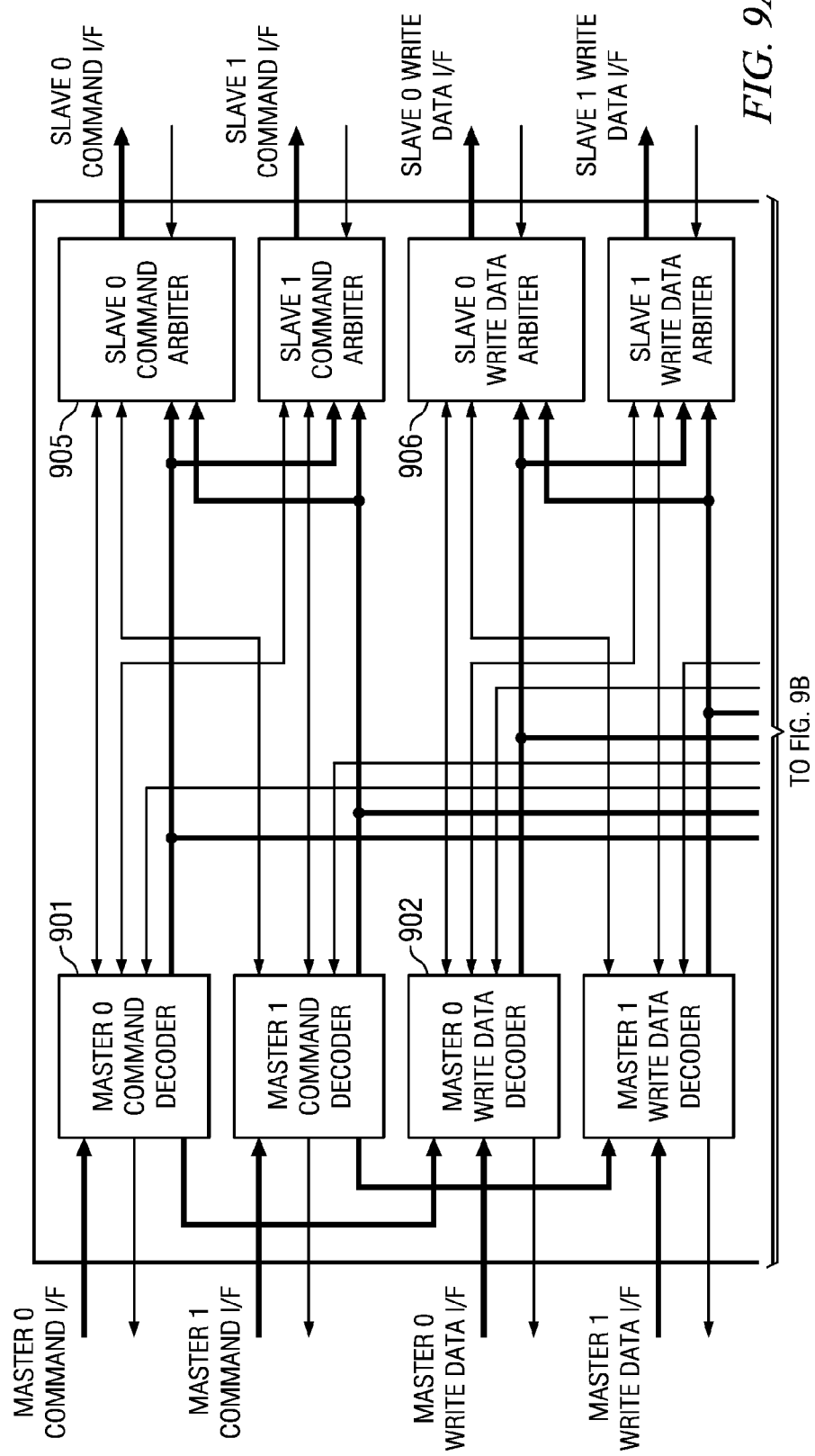

US 9,195,610 B2

TRANSACTION INFO BYPASS FOR NODES COUPLED TO AN INTERCONNECT FABRIC

CLAIM OF PRIORITY UNDER 35 U.S.C. 119(e)

The present application claims priority to and incorporates by reference U.S. Provisional Application No. 61/387,283, filed Sep. 28, 2010, entitled "Cache Controller Architecture."

FIELD OF THE INVENTION

This invention generally relates to management of memory access by remote requesters, and in particular to management of routing and command information included in a request packet.

BACKGROUND OF THE INVENTION

System on Chip (SoC) is a concept that strives to integrate more and more functionality into a given device. This integration can take the form of either hardware or solution software. Performance gains are traditionally achieved by increased clock rates and more advanced process nodes. Many SoC designs pair a digital signal processor (DSP) with a reduced instruction set computing (RISC) processor to target specific applications. A more recent approach to increasing performance has been to create multi-core devices.

Complex SoCs require a scalable and convenient method of connecting a variety of peripheral blocks such as processors, accelerators, shared memory and IO devices while addressing the power, performance and cost requirements of the end application. Due to the complexity and high performance requirements of these devices, the chip interconnect tends to be hierarchical and partitioned depending on the latency tolerance and bandwidth requirements of the endpoints. The connectivity among the endpoints tends to be more flexible to allow for future devices that may be derived from a current device. In this scenario, a management protocol used in a flexible interconnect may include overhead information to control routing of packets through an interconnect fabric.

BRIEF DESCRIPTION OF THE DRAWINGS

Particular embodiments in accordance with the invention will now be described, by way of example only, and with reference to the accompanying drawings:

FIG. 9, which includes FIGS. 9A and 9B, is a block diagram illustrating an example 2×2 switch fabric;

Figure 1:
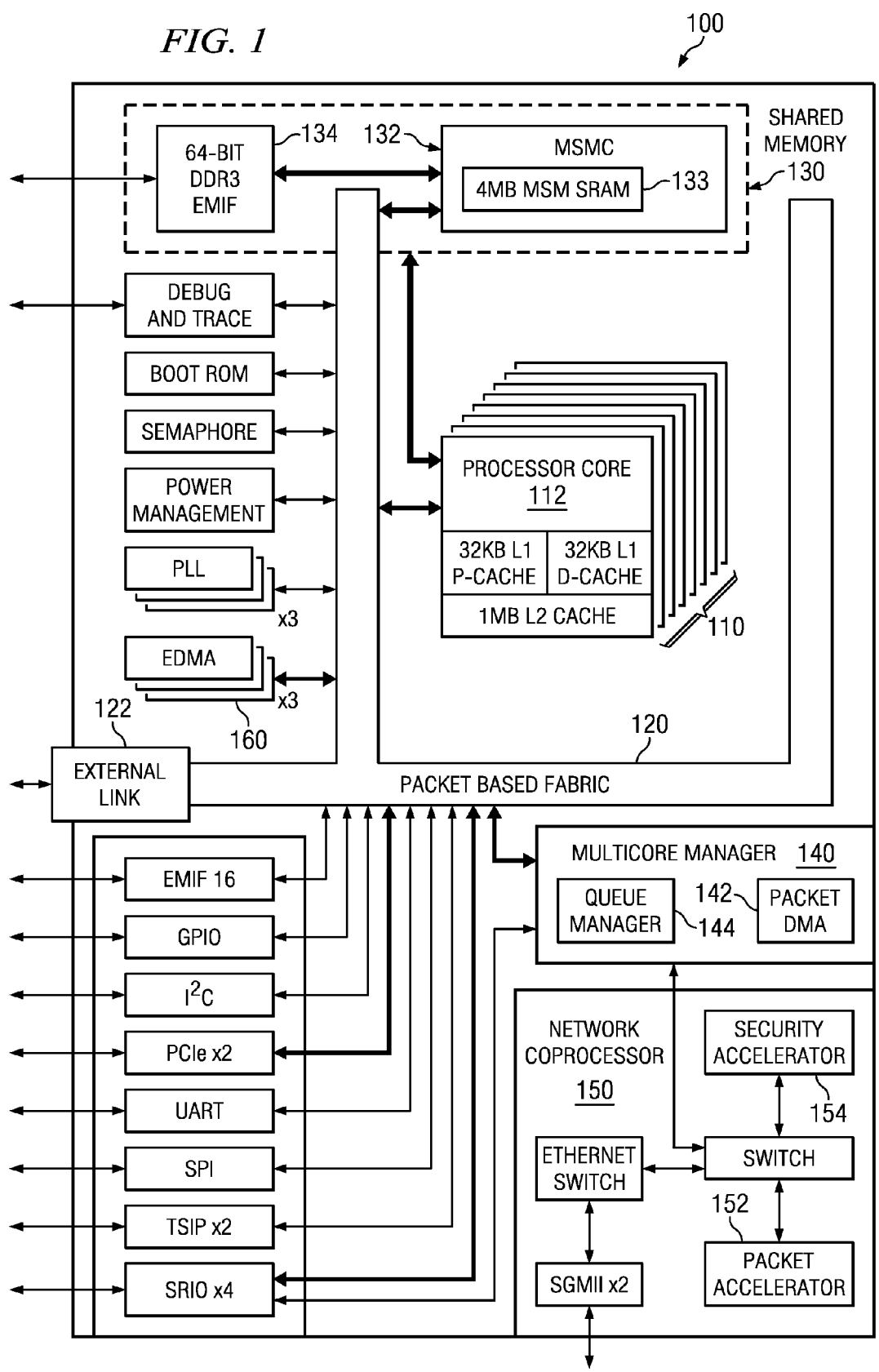
FIG. 1 is a functional block diagram of a system on chip (SoC) that includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision. A multi-core architecture that embodies an aspect of the present invention will be described herein. In a typically embodiment, a multi-core system is implemented as a single system on chip (SoC). As used herein, the term "core" refers to a processing module that may contain an instruction processor, such as a digital signal processor (DSP) or other type of microprocessor, along with one or more levels of cache that are tightly coupled to the processor.

In an embodiment that will be described in more detail below, multiple cores are interconnected via a packet based switch fabric that provides point to point interconnect between several devices on each cycle. Each core may receive requests from another core or from other external devices within the SoC to access various shared resources within the core, such as static random access memory (SRAM). Local SRAM memory accesses may be initiated by an external master via an interface within the core referred to as the SDMA (slave DMA). These external accesses (reads and writes) may be sent to a level 1 program (L1P) cache, a level 1 data (L1D) cache, or a level 2 (L2) cache depending on the address requested. Data and status are returned on reads and status on writes to the external master. A central routing module called the external memory controller (EMC) routes external access to the respective endpoint within the core after decoding the address.

According to protocol used for transactions on the packet based switch fabric, control information such as command ID and master ID are sent along with a command from an external master. This and additional information such as status and byte enables, which indicate valid bytes of data, are to be returned back to the external master. This information needs to be pipelined throughout the path of the transaction so that it can correctly routed to the slave and then back to correct master.

Unless otherwise managed, L1D, L1P and L2 endpoints all need to buffer the control data for each access pipeline/queue with each of the commands and the return data to follow protocol. The control information also needs to be routed back and forth between the EMC and the endpoints for the same purpose. This would cause area and routing overhead which can be avoided by providing a buffer in the EMC that is configured to store all such information and route only information absolutely required by the endpoints for the memory accesses.

Thus, in an embodiment of the invention, when external accesses reach the boundary of a core module, the EMC routes the accesses correctly to L1D, L1P or L2. Control data not absolutely needed by these destinations may be stored in a bypass buffer in the EMC and may then be appended and routed back with return data to the external master to follow protocol.

FIG. 1 is a functional block diagram of a system on chip (SoC) 100 that includes an embodiment of the invention. System 100 is a multi-core SoC that includes a set of processor modules 110 that each include a processor core, level one (L1) data and instruction caches, and a level two (L2) cache. In this embodiment, there are eight processor modules 110; however other embodiments may have fewer or greater number of processor modules. In this embodiment, each processor core is a digital signal processor (DSP); however, in other embodiments other types of processor cores may be used. A packet-based fabric 120 provides high-speed non-blocking channels that deliver as much as 2 terabits per second of on-chip throughput. Fabric 120 interconnects with shared memory 130 to provide an extensive two-layer memory structure in which data flows freely and effectively between processor modules 110, as will be described in more detail below. An example of SoC 100 is embodied in an SoC from Texas Instruments, and is described in more detail in "TMS320C6678—Multi-core Fixed and Floating-Point Signal Processor Data Manual", SPRS691, November 2010, which is incorporated by reference herein.

External link 122 provides direct chip-to-chip connectivity for local devices, and is also integral to the internal processing architecture of SoC 100. External link 122 is a fast and efficient interface with low protocol overhead and high throughput, running at an aggregate speed of 50 Gbps (four lanes at 12.5 Gbps each). Working in conjunction with a routing manager 140, link 122 transparently dispatches tasks to other local devices where they are executed as if they were being processed on local resources.

There are three levels of memory in the SoC 100. Each processor module 110 has its own level-1 program (L1P) and level-1 data (L1D) memory. Additionally, each module 110 has a local level-2 unified memory (L2). Each of the local memories can be independently configured as memory-mapped SRAM (static random access memory), cache or a combination of the two.

In addition, SoC 100 includes shared memory 130, comprising internal and external memory connected through the multi-core shared memory controller (MSMC) 132. MSMC 132 allows processor modules 110 to dynamically share the internal and external memories for both program and data. The MSMC internal RAM offers flexibility to programmers by allowing portions to be configured as shared level-2 RAM (SL2) or shared level-3 RAM (SL3). SL2 RAM is cacheable only within the local L1P and L1D caches, while SL3 is additionally cacheable in the local L2 caches.

External memory may be connected through the same memory controller 132 as the internal shared memory via external memory interface 134, rather than to chip system interconnect as has traditionally been done on embedded processor architectures, providing a fast path for software execution. In this embodiment, external memory may be treated as SL3 memory and therefore cacheable in L1 and L2.

SoC 100 may also include several co-processing accelerators that offload processing tasks from the processor cores in processor modules 110, thereby enabling sustained high application processing rates. SoC 100 may also contain an Ethernet media access controller (EMAC) network coprocessor block 150 that may include a packet accelerator 152 and a security accelerator 154 that work in tandem. The packet accelerator speeds the data flow throughout the core by transferring data to peripheral interfaces such as the Ethernet ports or Serial RapidIO (SRIO) without the involvement of any module 110's DSP processor. The security accelerator provides security processing for a number of popular encryption modes and algorithms, including: IPSec, SCTP, SRTP, 3GPP, SSL/TLS and several others.

Multi-core manager 140 provides single-core simplicity to multi-core device SoC 100. Multi-core manager 140 provides hardware-assisted functional acceleration that utilizes a packet-based hardware subsystem. With an extensive series of more than 8,000 queues managed by queue manager 144 and a packet-aware DMA controller 142, it optimizes the packet-based communications of the on-chip cores by practically eliminating all copy operations.

The low latencies and zero interrupts ensured by multi-core manager 140, as well as its transparent operations, enable new and more effective programming models such as task dispatchers. Moreover, software development cycles may be shortened significantly by several features included in multi-core manager 140, such as dynamic software partitioning. Multi-core manager 140 provides "fire and forget" software tasking that may allow repetitive tasks to be defined only once, and thereafter be accessed automatically without additional coding efforts.

Two types of buses exist in SoC 100 as part of packet based switch fabric 120: data buses and configuration buses. Some peripherals have both a data bus and a configuration bus interface, while others only have one type of interface. Furthermore, the bus interface width and speed varies from peripheral to peripheral. Configuration buses are mainly used to access the register space of a peripheral and the data buses are used mainly for data transfers. However, in some cases, the configuration bus is also used to transfer data. Similarly, the data bus can also be used to access the register space of a peripheral. For example, DDR3 memory controller 134 registers are accessed through their data bus interface.

Processor modules 110, the enhanced direct memory access (EDMA) traffic controllers, and the various system peripherals can be classified into two categories: masters and slaves. Masters are capable of initiating read and write transfers in the system and do not rely on the EDMA for their data transfers. Slaves on the other hand rely on the EDMA to perform transfers to and from them. Examples of masters include the EDMA traffic controllers, serial rapid I/O (SRIO), and Ethernet media access controller 150. Examples of slaves include the serial peripheral interface (SPI), universal asynchronous receiver/transmitter (UART), and inter-integrated circuit (I2C) interface.

Figure 2:
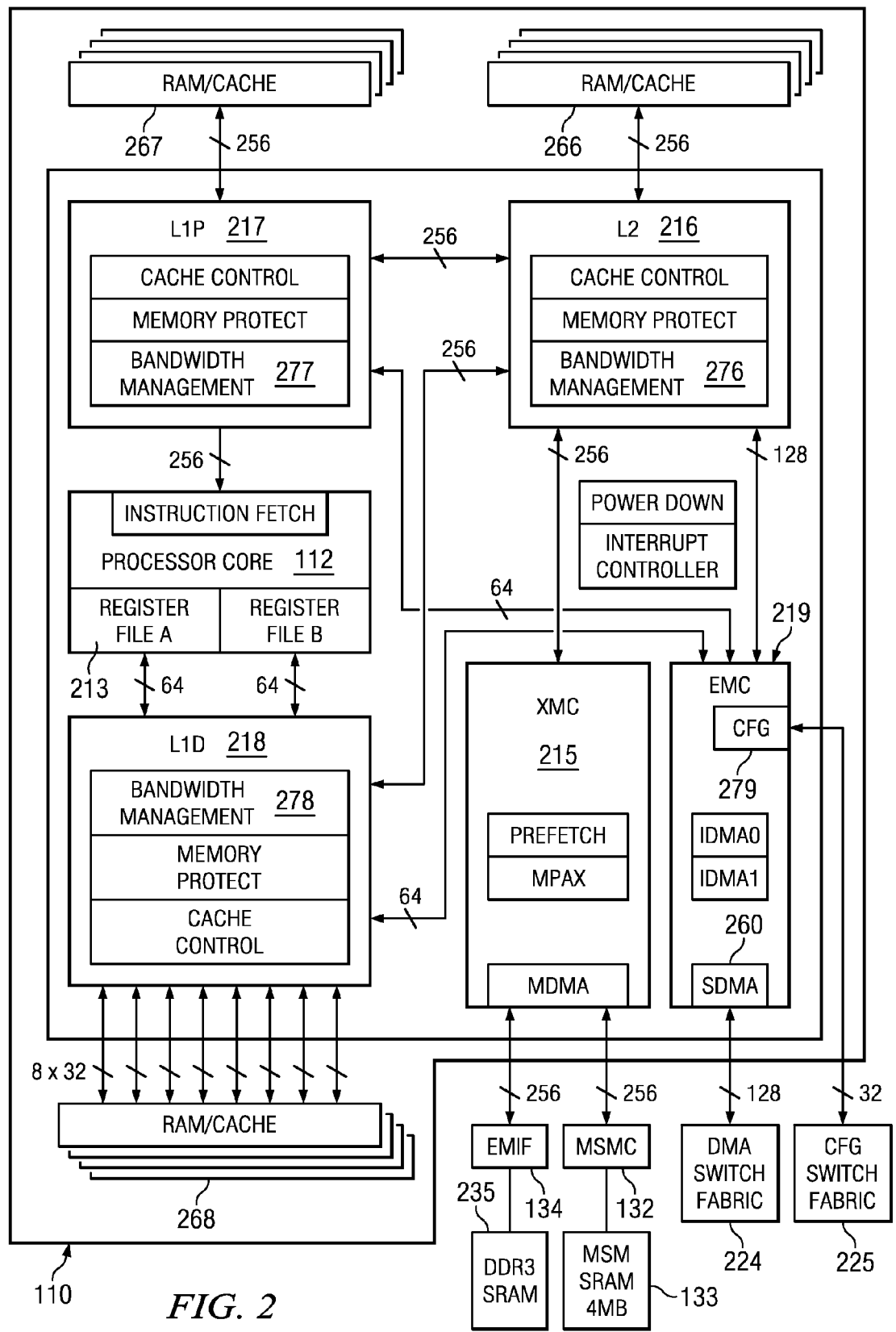
FIG. 2 is a more detailed block diagram of one processing module used in the SoC of FIG. 1.

FIG. 2 is a more detailed block diagram of one processing module 110 used in the SoC of FIG. 1. As mentioned above, SoC 100 contains two switch fabrics that form the packet based fabric 120 through which masters and slaves communicate. A data switch fabric 224, known as the data switched central resource (SCR), is a high-throughput interconnect mainly used to move data across the system. The data SCR is further divided into two smaller SCRs. One connects very high speed masters to slaves via 256-bit data buses running at a DSP/2 frequency. The other connects masters to slaves via 128-bit data buses running at a DSP/3 frequency. Peripherals that match the native bus width of the SCR it is coupled to can connect directly to the data SCR; other peripherals require a bridge.

A configuration switch fabric 225, also known as the configuration switch central resource (SCR), is mainly used to access peripheral registers. The configuration SCR connects the each processor module 110 and masters on the data switch fabric to slaves via 32-bit configuration buses running at a DSP/3 frequency. As with the data SCR, some peripherals require the use of a bridge to interface to the configuration SCR.

Bridges perform a variety of functions:
Conversion between configuration bus and data bus.
Width conversion between peripheral bus width and SCR bus width.
Frequency conversion between peripheral bus frequency and SCR bus frequency.

The priority level of all master peripheral traffic is defined at the boundary of switch fabric 120. User programmable priority registers are present to allow software configuration of the data traffic through the switch fabric. In this embodiment, a lower number means higher priority. For example: PRI=000b=urgent, PRI=111 b=low.

All other masters provide their priority directly and do not need a default priority setting. Examples include the processor module 110, whose priorities are set through software in a unified memory controller (UMC) 216 control registers. All the Packet DMA based peripherals also have internal registers to define the priority level of their initiated transactions.

DSP processor core 112 includes eight functional units (not shown), two register files 213, and two data paths. The two general-purpose register files 213 (A and B) each contain 32 32-bit registers for a total of 64 registers. The general-purpose registers can be used for data or can be data address pointers. The data types supported include packed 8-bit data, packed 16-bit data, 32-bit data, 40-bit data, and 64-bit data. Multiplies also support 128-bit data. 40-bit-long or 64-bit-long values are stored in register pairs, with the 32 LSBs of data placed in an even register and the remaining 8 or 32 MSBs in the next upper register (which is always an odd-numbered register). 128-bit data values are stored in register quadruplets, with the 32 LSBs of data placed in a register that is a multiple of 4 and the remaining 96 MSBs in the next 3 upper registers.

The eight functional units (.M1, .L1, .D1, .S1, .M2, .L2, .D2, and .S2) (not shown) are each capable of executing one instruction every clock cycle. The .M functional units perform all multiply operations. The .S and .L units perform a general set of arithmetic, logical, and branch functions. The .D units primarily load data from memory to the register file and store results from the register file into memory. Each .M unit can perform one of the following fixed-point operations each clock cycle: four 32×32 bit multiplies, sixteen 16×16 bit multiplies, four 16×32 bit multiplies, four 8×8 bit multiplies, four 8×8 bit multiplies with add operations, and four 16×16 multiplies with add/subtract capabilities. There is also support for Galois field multiplication for 8-bit and 32-bit data. Many communications algorithms such as FFTs and modems require complex multiplication. Each .M unit can perform one 16×16 bit complex multiply with or without rounding capabilities, two 16×16 bit complex multiplies with rounding capability, and a 32×32 bit complex multiply with rounding capability. The .M unit can also perform two 16×16 bit and one 32×32 bit complex multiply instructions that multiply a complex number with a complex conjugate of another number with rounding capability.

Communication signal processing also requires an extensive use of matrix operations. Each .M unit is capable of multiplying a [1×2] complex vector by a [2×2] complex matrix per cycle with or without rounding capability. Another version may allow multiplication of the conjugate of a [1×2] vector with a [2×2] complex matrix. for example. Each .M unit also includes IEEE floating-point multiplication operations, which includes one single-precision multiply each cycle and one double-precision multiply every 4 cycles. There is also a mixed-precision multiply that allows multiplication of a single-precision value by a double-precision value and an operation allowing multiplication of two single-precision numbers resulting in a double-precision number. Each .M unit can also perform one the following floating-point operations each clock cycle: one, two, or four single-precision multiplies or a complex single-precision multiply.

The .L and .S units support up to 64-bit operands. This allows for arithmetic, logical, and data packing instructions to allow parallel operations per cycle.

An MFENCE instruction is provided that will create a processor stall until the completion of all the processor-triggered memory transactions, including:
Cache line fills
Writes from L1D to L2 or from the processor module to MSMC and/or other system endpoints
Victim write backs
Block or global coherence operation
Cache mode changes
Outstanding XMC prefetch requests.

The MFENCE instruction is useful as a simple mechanism for programs to wait for these requests to reach their endpoint. It also provides ordering guarantees for writes arriving at a single endpoint via multiple paths, multiprocessor algorithms that depend on ordering, and manual coherence operations.

Each processor module 110 in this embodiment contains a 1024 KB level-2 memory (L2) controller 216, a 32 KB level-1 program memory (L1P) controller 217, and a 32 KB level-1 data memory (L1D) controller 218. The device also contains a 4096 KB multi-core shared memory (MSM) 132. All memory in SoC 100 has a unique location in the memory map.

Figure 3:
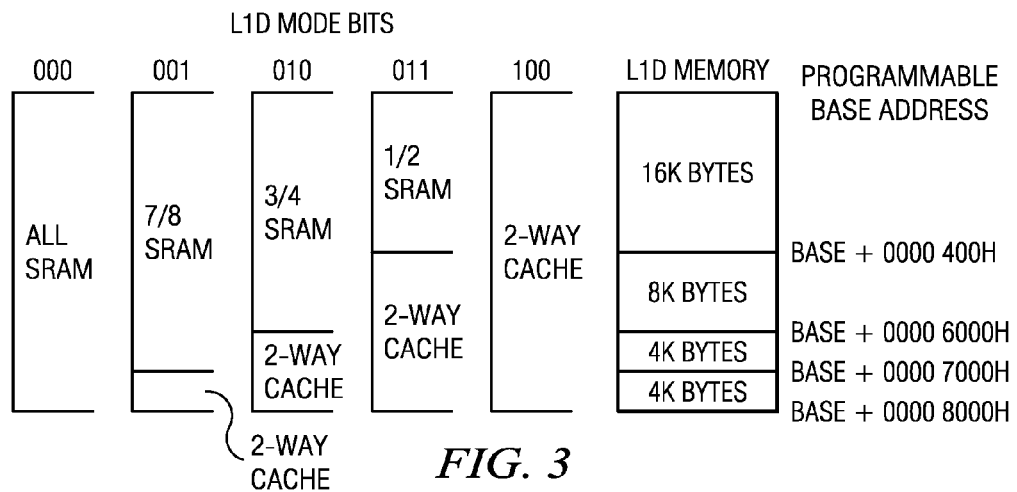
FIGS. 3 and 4 illustrate configuration of the L1 and L2 caches.

The L1P cache 267 and L1D cache 266 can be reconfigured via software through the L1PMODE field of the L1P Configuration Register (L1PCFG) and the L1DMODE field of the L1D Configuration Register (L1DCFG) of each processor module 110 to be all SRAM, all cache memory, or various combinations as illustrated in FIG. 3, which illustrates an L1D configuration; L1P configuration is similar. L1D is a two-way set-associative cache, while L1P is a direct-mapped cache.

Figure 4:
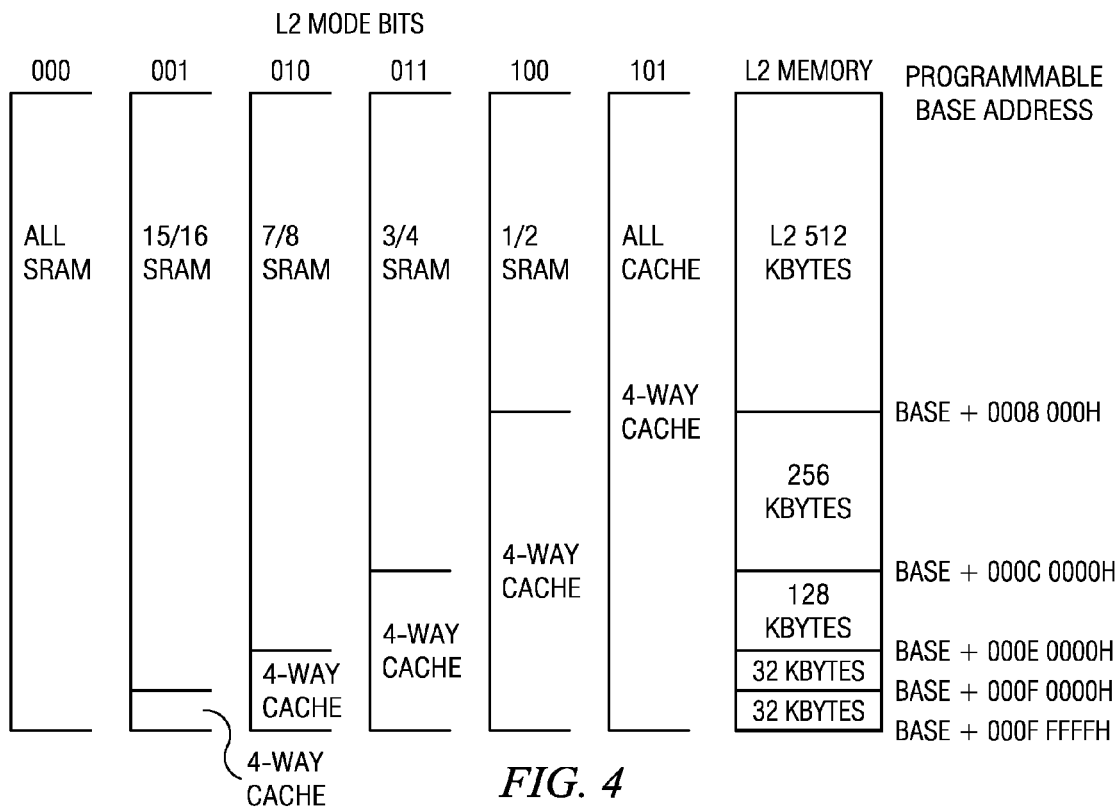

L2 memory 268 can be configured as all SRAM, all 4-way set-associative cache, or a mix of the two, as illustrated in FIG. 4. The amount of L2 memory that is configured as cache is controlled through the L2MODE field of the L2 Configuration Register (L2CFG) of each processor module 110.

Global addresses are accessible to all masters in the system. In addition, local memory can be accessed directly by the associated processor through aliased addresses, where the eight MSBs are masked to zero. The aliasing is handled within each processor module 110 and allows for common code to be run unmodified on multiple cores. For example, address location 0x10800000 is the global base address for processor module 0's L2 memory. DSP Core 0 can access this location by either using 0x10800000 or 0x00800000. Any other master in SoC 100 must use 0x10800000 only. Conversely, 0x00800000 can by used by any of the cores as their own L2 base addresses.

Level 1 program (L1P) memory controller (PMC) 217 controls program cache memory 267 and includes memory protection and bandwidth management. Level 1 data (L1D) memory controller (DMC) 218 controls data cache memory 268 and includes memory protection and bandwidth management. Level 2 (L2) memory controller, unified memory controller (UMC) 216 controls L2 cache memory 266 and includes memory protection and bandwidth management. External memory controller (EMC) 219 includes Internal DMA (IDMA) and a slave DMA (SDMA) interface that is coupled to data switch fabric 224. The EMC is coupled to configuration switch fabric 225. Extended memory controller (XMC) 215 includes a master DMA (MDMA) interface that is coupled to MSMC 132 and to dual data rate 3 (DDR3) external memory controller 134. MSMC 132 is coupled to on-chip shared memory 133. External memory controller 134 may be coupled to off-chip DDR3 memory 235 that is external to SoC 100. A master DMA controller (MDMA) within XMC 215 may be used to initiate transaction requests to on-chip shared memory 133 and to off-chip shared memory 235.

Referring again to FIG. 2, when multiple requestors contend for a single resource within processor module 110, the conflict is resolved by granting access to the highest priority requestor. The following four resources are managed by the bandwidth management control hardware 276-279:

Level 1 Program (L1P) SRAM/Cache 217
Level 1 Data (L1D) SRAM/Cache 218
Level 2 (L2) SRAM/Cache 216
EMC 219

The priority level for operations initiated within the processor module 110 are declared through registers within each processor module 110. These operations are:

DSP-initiated transfers
User-programmed cache coherency operations
IDMA-initiated transfers The priority level for operations initiated outside the processor modules 110 by system peripherals is declared through the Priority Allocation Register (PRI_ALLOC). System peripherals that are not associated with a field in PRI_ALLOC may have their own registers to program their priorities.

Figure 5:
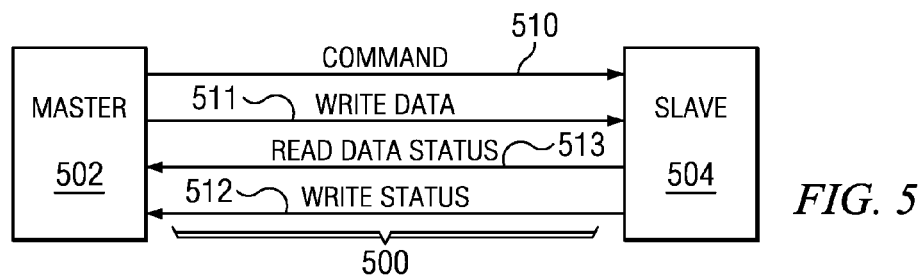
FIG. 5 is a simplified schematic of a portion of a packet based switch fabric used in the SoC of FIG. 1.

FIG. 5 is a simplified schematic of a portion 500 of a packet based switch fabric 120 used in SoC 100 in which a master 502 is communicating with a slave 504. FIG. 5 is merely an illustration of a single point in time when master 502 is coupled to slave 504 in a virtual connection through switch fabric 120. This virtual bus for modules (VBUSM) interface provides an interface protocol for each module that is coupled to packetized fabric 120. The VBUSM interface is made up of four physically independent sub-interfaces: a command interface 510, a write data interface 511, a write status interface 512, and a read data/status interface 513. While these sub-interfaces are not directly linked together, an overlying protocol enables them to be used together to perform read and write operations. In this figure, the arrows indicate the direction of control for each of the sub-interfaces.

Tables 1-4 provide a summary of the command interface signals, write interface signals, read interface signals and write status interface signals, respectively, used in the VBUSM of this embodiment. The VBUSM interface will be described in some detail below in order to provide an example of command and status information that may be included in a transaction request to a shared resource that is not needed for the actual access to the shared resource. Other embodiments may use an altogether different type of interconnect mechanism, however, in which different types of overhead information may occur.

Information is exchanged across VBUSM using transactions that are comprised at the lowest level of one or more data phases. Read transactions on VBUSM can be broken up into multiple discreet burst transfers that in turn are comprised of one or more data phases. The intermediate partitioning that is provided in the form of the burst transfer allows prioritization of traffic within the system since burst transfers from different read transactions are allowed to be interleaved across a given interface. This capability can reduce the latency that high priority traffic experiences even when large transactions are in progress.

TABLE 1

VBUSM Command Interface Signals Summary

| Signal Name | Driver | Master Width | Master Class | Slave Width | Slave Class | Default Value | Function |
|---|---|---|---|---|---|---|---|
| creq | Master | 1 | R | 1 | R | — | Request. |
| cmstid | Infra | — | — | 8 | R | — | Master ID |
| cid | Master | 4 | R | 4 | R | — | Transaction ID |
| caddress | Master | 32 | R | P | R | — | Transaction target address |
| crsel | Infra | — | — | 4 | O | 0 | Region Select |
| cdir | Master | 1 | R | 1 | R | — | Transaction type |
| cbytecnt | Master | 10 | R | 10 | R | — | Transaction byte count. |
| camode | Master | 2 | O | 2 | R | 0 | Addressing mode indicator |
| cclsize | Master | 3 | O | 3 | R | 0 | Burst address wrap indicator |
| cexcl | Master | 1 | O | 1 | R | 0 | Exclusive access attribute |
| cpriority | Master | 3 | R | 3 | R | — | Priority level attribute |
| cepriority | Master | 3 | R | 3 | O | cpriority value | Escalated priority level |
| cnogap | Master | 1 | O | 1 | O | 0 | Contiguous byte enable attribute |
| cemudbg | Master | 1 | O | 1 | O | 0 | Emulation debug access attribute |
| cdepend | Master | 1 | O | 1 | O | 1 | Transaction dependency |
| cprivid | Master | 4 | O | 4 | O | 0 | Privilege ID |

TABLE 1-continued

VBUSM Command Interface Signals Summary

| Signal Name | Driver | Master Width | Master Class | Slave Width | Slave Class | Default Value | Function |
|---|---|---|---|---|---|---|---|
| ccaable | Master | 1 | O | 1 | O | 0 | Cacheable attribute |
| cdtype | Master | 2 | O | 2 | O | 2 | Data type attribute |
| cdone | Master | 1 | O | 1 | R | 1 | Logical transaction done indicator |
| cready | Slave | 1 | R | 1 | R | — | Command ready |

TABLE 2

VBUSM Write Data Interface Signals

| Signal Name | Driver | Master Width | Master Class | Slave Width | Slave Class | Default Value | Function |
|---|---|---|---|---|---|---|---|
| wreq | Master | 1 | R | 1 | R | — | Write transfer request |
| walign | Master | 5 | R | 5 | O | — | Write alignment |
| wfirst | Master | 1 | R | 1 | O | — | Write first data phase in transaction indicator |
| wlast | Master | 1 | R | 1 | R | — | Write last data phase in transaction indicator |
| wxcnt | Master | 1, 2, 3, 4, 5, 6 | R | 1, 2, 3, 4, 5, 6 | O | — | Write bytes transferred in data phase count |
| wbyten | Master | ⅛th wdata width | R | ⅛th wdata width | R | — | Write byte enables. |
| wdata | Master | 8, 16, 32, 64, 128, 256 | R | 8, 16, 32, 64, 128, 256 | R | — | Write data |
| wready | Slave | 1 | R | 1 | O | 1 | Write ready |

TABLE 3

VBUSM Read Data/Status Interface Signals

| Signal Name | Driver | Master Width | Master Class | Slave Width | Slave Class | Default Value | Function |
|---|---|---|---|---|---|---|---|
| rreq | Slave | 1 | R | 1 | R | — | Read transfer request |
| rmstid | Slave | — | — | 8 | R | — | Read master ID |
| rid | Slave | 4 | R | 4 | R | — | Read transaction ID |
| ralign | Slave | 5 | O | 5 | R | — | Read alignment |
| rbytecnt | Slave | 7 | O | 7 | R | — | Read transfer byte count |
| rpriority | Slave | 3 | O | 3 | R | — | Read priority |
| repriority | Slave | 3 | O | 3 | O | Rpriority value | Read escalated priority |
| rbfirst | Slave | 1 | O | 1 | R | — | Read first data phase in burst transfer indicator |
| rblast | Slave | 1 | R | 1 | R | — | Read last data phase in burst transfer indicator |
| rfirst | Slave | 1 | O | 1 | R | — | Read first data phase in transaction indicator |
| rlast | Slave | 1 | R | 1 | R | — | Read last data phase in transaction indicator |
| rxcnt | Slave | 1, 2, 3, 4, 5, 6 | O | 1, 2, 3, 4, 5, 6 | R | — | Read bytes transferred in data phase count |
| rbyten | Slave | ⅛$^{th}$ rdata width | R | ⅛$^{th}$ rdata width | R | — | Read byte enables. |

TABLE 3-continued

VBUSM Read Data/Status Interface Signals

| Signal Name | Driver | Master Width | Master Class | Slave Width | Slave Class | Default Value | Function |
|---|---|---|---|---|---|---|---|
| rdata | Slave | 8, 16, 32, 64, 128, 256 | R | 8, 16, 32, 64, 128, 256 | R | — | Read data |
| rstatus | Slave | 3 | O | 3 | O | 0 | Read status |
| rperm | Slave | 8 | O | 8 | O | 0xFF | Read permissions tag |
| rdone | Slave | 1 | R | 1 | R | — | Read logical transaction done indicator |
| rsready | Slave | 1 | R | 1 | O | 1 | Read slave ready |
| rmready | Master | 1 | O | 1 | R | 1 | Read master ready |

TABLE 4

VBUSM Write Status Interface Signals

| Signal Name | Driver | Master Width | Master Class | Slave Width | Slave Class | Default Value | Function |
|---|---|---|---|---|---|---|---|
| sreq | Slave | 1 | R | 1 | R | — | Transfer request |
| smstid | Slave | — | — | 8 | R | — | Master ID |
| sid | Slave | 4 | R | 4 | R | — | Transaction ID |
| sstatus | Slave | 3 | O | 3 | R | — | Write status |
| sdone | Slave | 1 | R | 1 | R | — | Logical transaction done indicator |
| sready | Master | 1 | O | 1 | R | 1 | Transfer ready indicator |

Write Operation

A write operation across the VBUSM interface begins with a master transferring a single command to the slave across the command interface that indicates the desired operation is a write and gives all of the attributes of the transaction. Beginning on the cycle after the command is transferred, if no other writes are in progress or at most three write data interface data phases later if other writes are in progress, the master transfers the corresponding write data to the slave across the write data interface in a single corresponding burst transfer. Optionally, the slave returns zero or more intermediate status words (sdone==0) to the master across the write status interface as the write is progressing. These intermediate status transactions may indicate error conditions or partial completion of the logical write transaction. After the write data has all been transferred for the logical transaction (as indicated by cid) the slave transfers a single final status word (sdone==1) to the master across the write status interface which indicates completion of the entire logical transaction.

Read Operation

A read operation across the VBUSM interface is accomplished by the master transferring a single command to the slave across the command interface that indicates the desired operation is a read and gives all of the attributes of the transaction. After the command is issued, the slave transfers the read data and corresponding status to the master across the read data interface in one or more discreet burst transfers.

Figure 6:
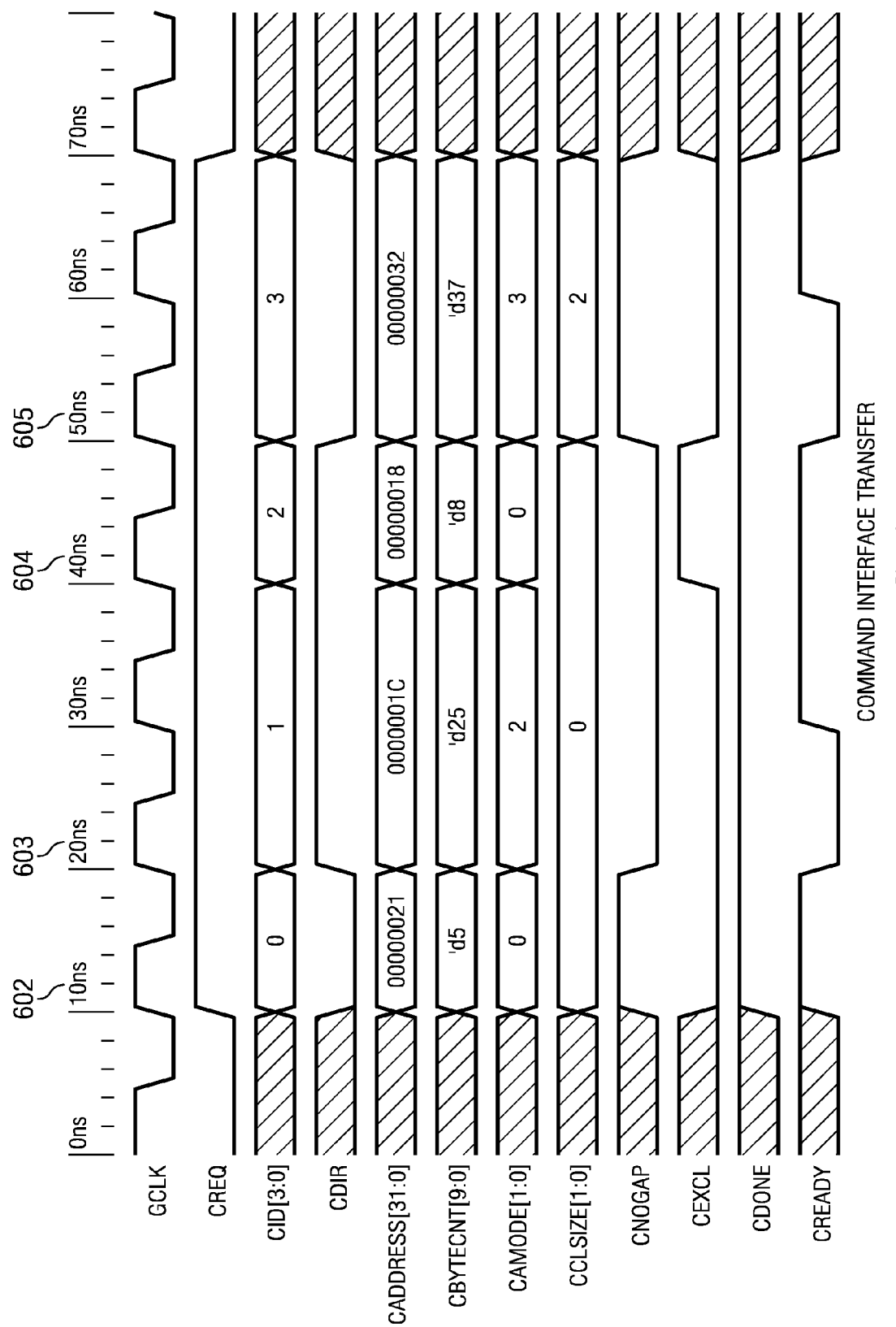
FIGS. 6-8 are timing diagrams of transactions on the packet based switch fabric.

FIG. 6 is a timing diagram illustrating a command interface transfer on the VBUSM interface. The command interface is used by the master to transfer transaction parameters and attributes to a targeted slave in order to provide all of information necessary to allow efficient data transfers across the write data and read data/status interfaces. Each transaction across the VBUSM interface can transfer up to 1023 bytes of data and each transaction requires only a single data phase on the command interface to transfer all of the parameter and attributes.

After the positive edge of clk, the master performs the following actions in parallel on the command interface for each transaction command:

Drives the request (creq) signal to 1;

Drives the command identification (cid) signals to a value that is unique from that of any currently outstanding transactions from this master;

Drives the direction (cdir) signal to the desired value (0 for write, 1 for read);

Drives the address (caddress) signals to starting address for the burst;

Drives the address mode (camode) and address size (cclsize) signals to appropriate values for desired addressing mode;

Drives the byte count (cbytecnt) signals to indicate the size of transfer window;

Drives the no gap (cnogap) signal to 1 if all byte enables within the transfer window will be asserted;

Drives the secure signal (csecure) to 1 if this is a secure transaction;

Drives the dependency (cdepend) signal to 1 if this transaction is dependent on previous transactions;

Drives the priority (cpriority) signals to appropriate value (if used);

Drives the priority (cepriority) signals to appropriate value (if used);

Drives the done (cdone) to appropriate value indicating if this is the final physical transaction in a logical transaction (as defined by cid); and Drives all other attributes to desired values.

Simultaneously with each command assertion, the slave asserts the ready (cready) signal if it is ready to latch the transaction control information during the current clock cycle. The slave is required to register or tie off cready and as a result, slaves must be designed to pre-determine if they are able to accept another transaction in the next cycle.

The master and slave wait until the next positive edge of clk. If the slave has asserted cready the master and slave can move to a subsequent transaction on the control interface, otherwise the interface is stalled.

In the example illustrated in FIG. 6, four commands are issued across the interface: a write 602, followed by two reads 603, 604, followed by another write 605. The command identification (cid) is incremented appropriately for each new command as an example of a unique ID for each command. The slave is shown inserting a single wait state on the second and fourth commands by dropping the command ready (cready) signal.

Figure 7:
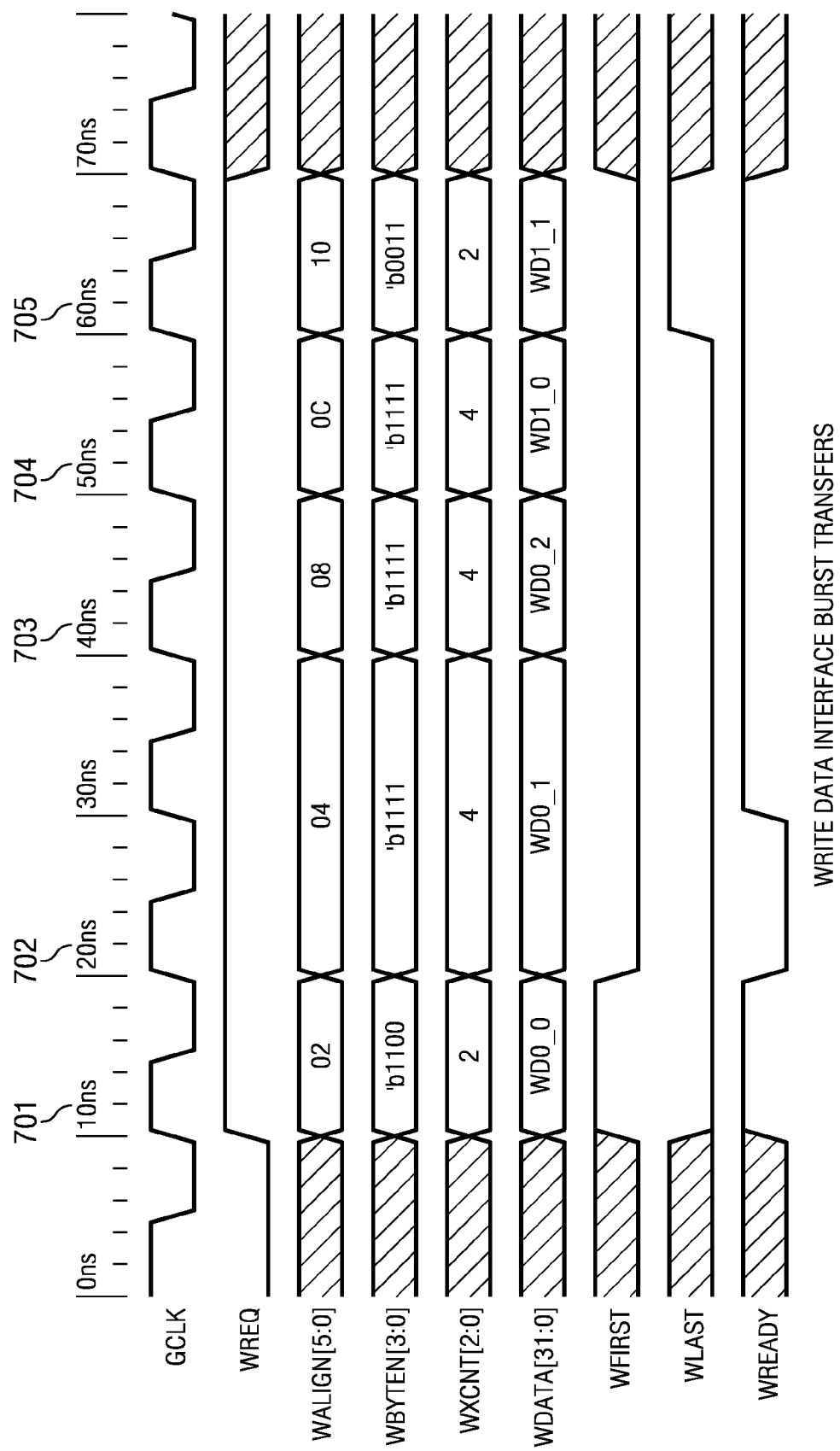

FIG. 7 is a timing diagram illustrating a write data burst in the VBUSM interface. The master must present a write data transaction on the write data interface only after the corresponding write command transaction has been completed on the command interface.

The master transfers the write data in a single burst transfer across the write data interface. The burst transfer is made up of one or more data phases and the individual data phases are tagged to indicate if they are the first and/or last data phase within the burst.

Endpoint masters must present valid write data on the write data interface on the cycle following the transfer of the corresponding command if the write data interface is not currently busy from a previous write transaction. Therefore, when the command is issued the write data must be ready to go. If a previous write transaction is still using the interface, the write data for any subsequent transactions that have already been presented on the command interface must be ready to be placed on the write data interface without delay once the previous write transaction is completed. As was detailed in the description of the creq signal, endpoint masters should not issue write commands unless the write data interface has three or less data phases remaining from any previous write commands.

After the positive edge of clk, the master performs the following actions in parallel on the write data interface:
  Drives the request (wreq) signal to 1;
  Drives the alignment (walign) signals to the five LSBs of the effective address for this data phase;
  Drives the byte enable (wbyten) signals to a valid value that is within the Transfer Window;
  Drives the data (wdata) signals to valid write data for data phase;
  Drives the first (wfirst) signal to 1 if this is the first data phase of a transaction;
  Drives the last (wlast) signal to 1 if this is the last data phase of the transaction.

Simultaneously with each data assertion, the slave asserts the ready (wready) if it is ready to latch the write data during the current clock cycle and terminate the current data phase. The slave is required to register or tie off wready and as a result, slaves must be designed to pre-determine if they are able to accept another transaction in the next cycle.

The master and slave wait until the next positive edge of clk. If the slave has asserted wready the master and slave can move to a subsequent data phase/transaction on the write data interface, otherwise the data interface stalls.

Data phases are completed in sequence using the above handshaking protocol until the entire physical transaction is completed as indicated by the completion of a data phase in which wlast is asserted.

Physical transactions are completed in sequence using the above handshaking protocol until the entire logical transaction is completed as indicated by the completion of a physical transaction for which cdone was asserted.

In the example VBUSM write data interface protocol illustrated in FIG. 7, a 16 byte write transaction is accomplished across a 32-bit wide interface. The starting address for the transaction is at a 2 byte offset from a 256-byte boundary. The entire burst consists of 16 bytes and requires five data phases 701-705 to complete. Notice that wfirst and wlast are toggled accordingly during the transaction. Data phase 702 is stalled for one cycle by the slave de-asserting wready.

Figure 8:
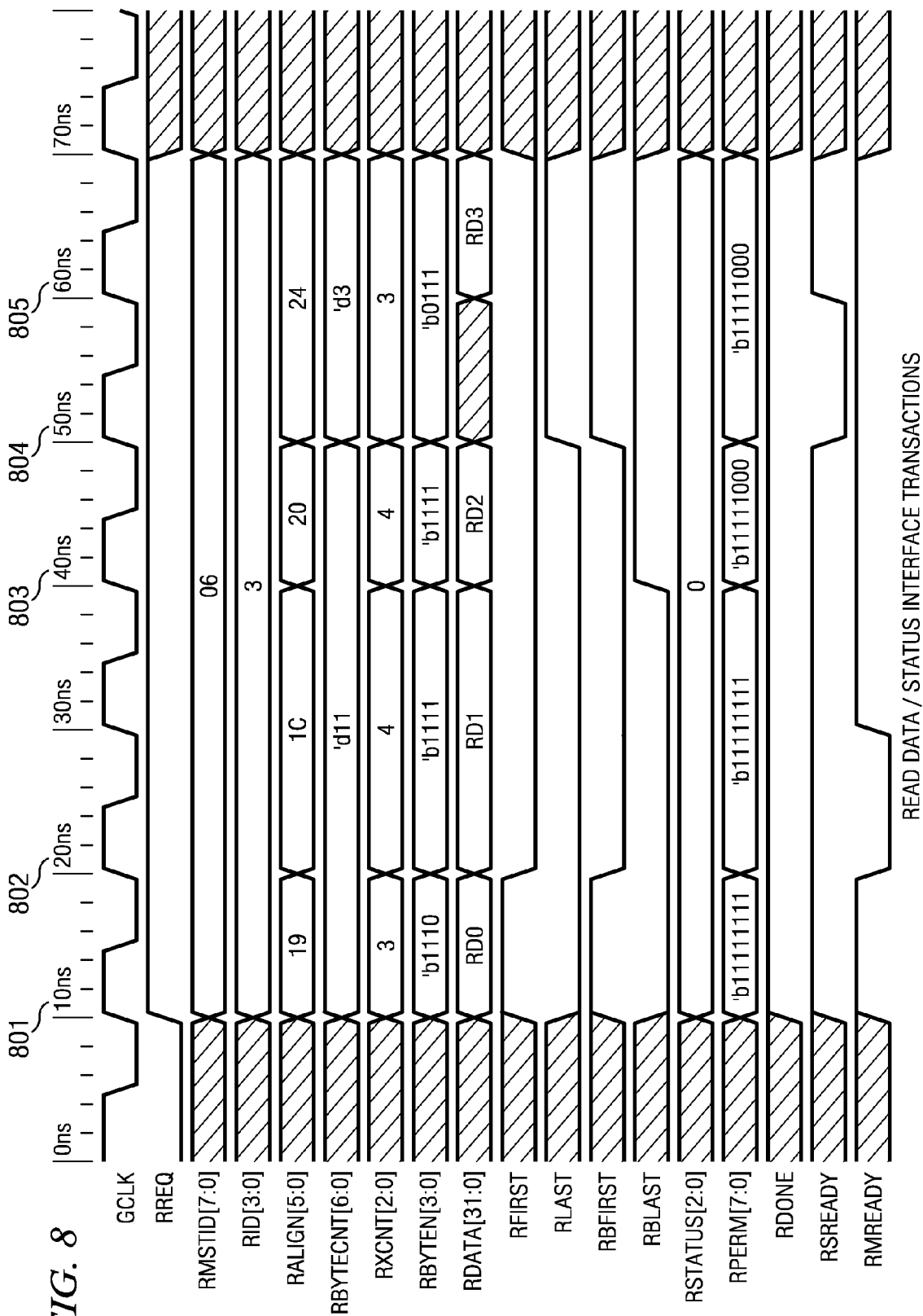

FIG. 8 is a timing diagram illustrating a read data burst in the VBUSM interface. After a read transaction command is presented on the command interface the slave is required to transfer all of the specified read data back to the requesting master. The slave transfers the read data in a sequence of one or more burst transfers across the read data/status interface. If the slave chooses to complete the read data transfer using more than one burst transfer (required if the transaction is longer than 64 bytes) the ordering of transfers must be preserved within the transaction. Each burst is made up of one or more data phases and includes tagging information to indicate whether the burst is the first and/or last burst in the overall read transaction. Additionally, within each burst transfer the individual data phases are tagged to indicate if they are the first and/or last data phase within the burst.

To summarize, the data transfers for each write transaction are completed using a series of one or more burst transfers on the write data interface. Each burst transfer is in turn a series of one or more data phases on the interface. By breaking up the read data transfers into shorter bursts, traffic can be more precisely arbitrated so that high priority read returns can be inserted in the middle of lower priority read returns.

A summary of the individual actions taken by the master and slave during each data phase of a transfer on the read data interface is as follows. After the positive edge of clk, the slave performs the following actions in parallel on the read data interface:
  Drives rreq to 1;
  Drives rmstid to the value given on the cmstid signal in the command;
  Drives rid to the value given on the cid signal in the command;
  Drives ralign to the 5 LSBs of the effective address for this data phase;
  Drives rbytecnt to size of Transfer Window for burst transfer;
  Drives rfirst to 1 if this is the first data phase of a transaction;
  Drives rlast to 1 if this is the last data phase of the transaction;
  Drives rbfirst to 1 if this is the first data phase in the burst transfer;
  Drives rblast to 1 if this is the last data phase in the burst transfer;
  Drives rpriority to value given on the cpriority signal in the command;
  Drives repriority to appropriate value based on currently pending read transactions;
  Drives rsready to 1 if the slave will provide valid data on the rdata bus in the current clock cycle;
  Drives rbyten to a valid value that is within the Transfer Window;
  Drives rdata to valid read data for first data phase;
  Drives rstatus to a valid value (if rsready is 1) that indicates if an error/exception has occurred during the transaction;
  Drives rperm to valid access permissions (if rsready is 1) corresponding to the CPU identifier given in the cprovid. A slave should return all 1s in rperm if it does not implement access permissions.

In the example in FIG. 8, a 14 byte read transaction is accomplished across a 32-bit wide interface using 2 burst transfers. The starting address for the transaction is at a 25 byte (0x19) offset from a 256-bit boundary. The first burst consists of 11 bytes and requires 3 data phases 801, 802, 803 to complete. The second burst consists of 3 bytes and requires a single data phase 805 to complete. Notice that rfirst and rlast are toggled accordingly during each of the burst transfers and that rdone is asserted during the last burst transfer. A single wait state is inserted by the master during the second data phase 802 of the first burst and a single wait state is inserted by the slave during the data phase of the second burst 804. Note that burst transfers from other slaves and/or commands of higher priority could have also been inserted between the burst transfers shown in this example. Additionally, note that it is not required that burst transfers be performed back to back without intervening dead cycles.

In a similar manner on the write status interface, after the slave accepts the last data phase of the last physical transaction within a logical write transaction the slave is required to send back the completion status for the write to the originating master. The slave may also send back intermediate responses (with sdone de-asserted) prior to completing the entire logical transaction. Only a single status data phase is required for each write status transaction.

Figure 9B:
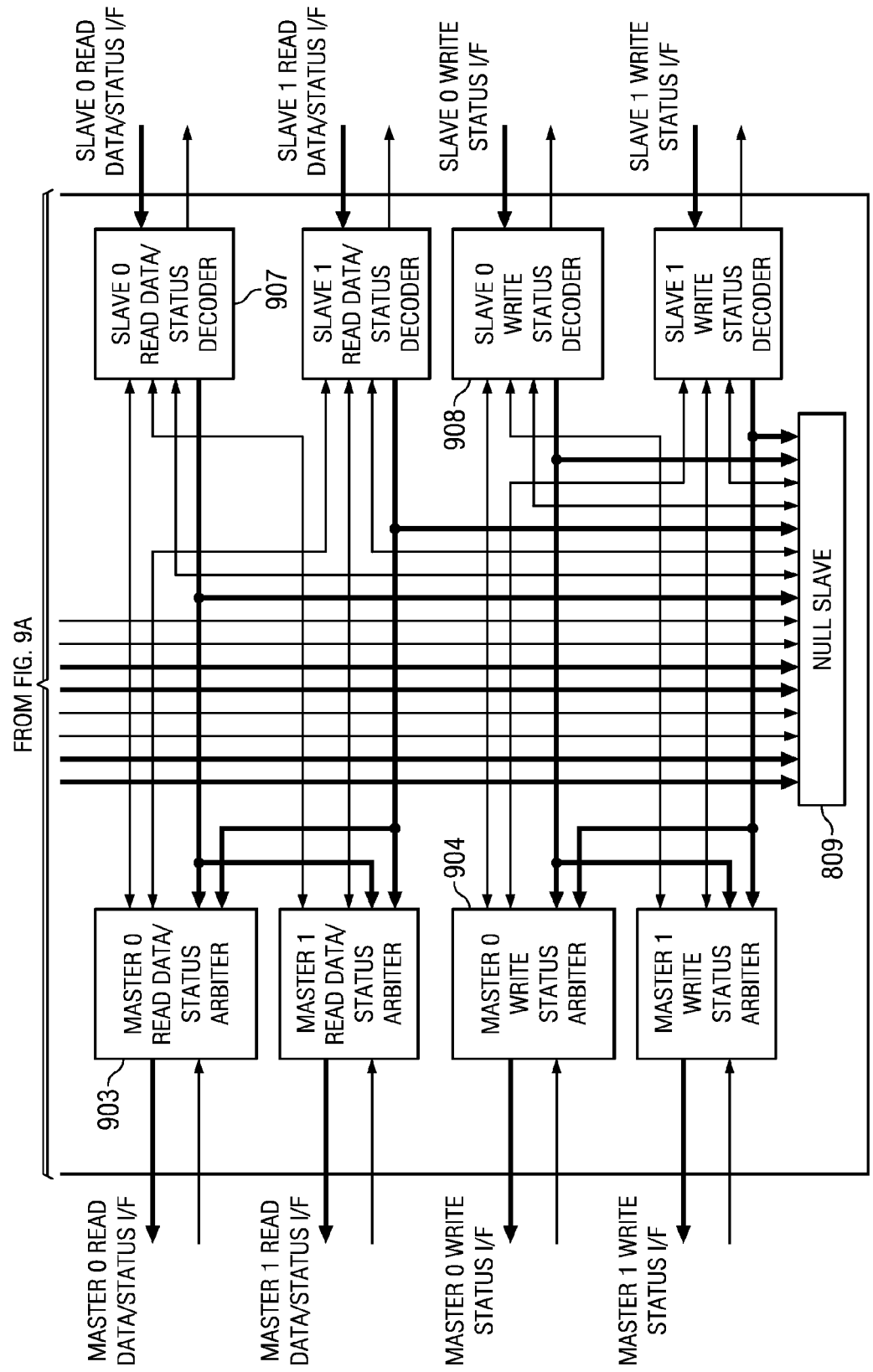

FIG. 9 is a block diagram illustrating an example 2×2 packet based switch fabric, for simplicity. The switched fabric is referred to as a "switched central resource" (SCR) herein. In SoC 100, SCR 120 includes 9×9 nodes for the eight processor cores 110 and the MSMC 132. Additional nodes are included for the various peripheral devices and coprocessors, such as multi-core manager 140.

From the block diagram it can be seen that there are nine different sub-modules within the VBUSM SCR that each perform specific functions. The following sections briefly describe each of these blocks. Each master interface includes a set of modules similar to modules 901, 902, 903, 904. Each slave interface includes a set of modules similar to modules 905, 906, 907, 908.

A command decoder block in each master command interface 901 is responsible for the following:

Inputs all of the command interface signals from the master peripheral;

Decodes the caddress to determine to which slave peripheral port and to which region within that port the command is destined;

Encodes crsel with region that was hit within the slave peripheral port;

Decodes cepriority to create a set of one-hot 8-bit wide request buses that connect to the command arbiters of each slave that it can address;

Stores the address decode information for each write command into a FIFO that connects to the write data decoder for this master to steer the write data to the correct slave;

Multiplexes the cready signals from each of the command arbiters and outputs the result to the attached master peripheral.

The size and speed of the command decoder for each master peripheral is related to the complexity of the address map for all of the slaves that master can access. The more complex the address map, the larger the decoder and the deeper the logic that is required to implement. The depth of the FIFO that is provided in the command decoder for the write data decoder's use is determined by the number of simultaneous outstanding transactions that the attached master peripheral can issue. The width of this FIFO is determined by the number of unique slave peripheral interfaces on the SCR that this master peripheral can access.

A write data decoder in each master write data interface 902 is responsible for the following:

Inputs all of the write data interface signals from the master peripheral;

Reads the address decode information from the FIFO located in the command decoder for this master peripheral to determine to which slave peripheral port the write data is destined;

Multiplexes the wready signals from each of the write data arbiters and outputs the result to the attached master peripheral.

A read data arbiter in each master read data and status interface 903 is responsible for the following:

Inputs all of the read data interface signals and one-hot priority encoded request buses from the read data decoders for all the slave peripherals that can be accessed by this master peripheral;

Uses the one-hot priority encoded request buses, an internal busy indicator, and previous owner information to arbitrate the current owner of the master peripheral's read data interface using a two tier algorithm;

Multiplexes the read data interface signals from the different slaves onto the master peripheral's read data interface based on the current owner;

Creates unique rmready signals to send back to each of the read data decoders based on the current owner and the state of the master peripheral's rmready;

Determines the numerically lowest repriority value from all of the requesting slaves and outputs this value as the repriority to the master.

A write status arbiter in each master write status interface 904 is responsible for the following:

Inputs all of the write status interface signals and request signals from the write status decoders for all the slave peripherals that can be accessed by this master peripheral;

Uses the request signals, an internal busy indicator, and previous owner information to arbitrate the current owner of the master peripheral's write status interface using a simple round robin algorithm;

Multiplexes the write status interface signals from the different slaves onto the master peripheral's write status interface based on the current owner;

Creates unique sready signals to send back to each of the write status decoders based on the current owner and the state of the master peripheral's sready.

A command arbiter in each slave command interface 905 is responsible for the following:

Inputs all of the command interface signals and one-hot priority encoded request buses from the command decoders for all the master peripherals that can access this slave peripheral Uses the one-hot priority encoded request buses, an internal busy indicator, and previous owner information to arbitrate the current owner of the slave peripheral's command interface using a two tier algorithm.

Multiplexes the command interface signals from the different masters onto the slave peripheral's command interface based on the current owner.

Creates unique cready signals to send back to each of the command decoders based on the current owner and the state of the slave peripheral's cready.

Determines the numerically lowest cepriority value from all of the requesting masters and any masters that currently have requests in the command to write data source selection FIFO and outputs this value as the cepriority to the slave.

Prevents overflow of the command to write data source selection FIFO by gating low the creq (going to the slave) and cready (going to the masters) signals anytime the FIFO is full.

A write data arbiter in each slave write data interface 906 is responsible for the following:

- Inputs all of the write data interface signals from the write data decoders for all the master peripherals that can access this slave peripheral;
- Provides a strongly ordered arbitration mechanism to guarantee that write data is presented to the attached slave in the same order in which write commands were accepted by the slave;
- Multiplexes the write data interface signals from the different masters onto the slave peripheral's write data interface based on the current owner;
- Creates unique wready signals to send back to each of the write data decoders based on the current owner and the state of the slave peripheral's wready.

A read data decoder in each slave read data and status interface 907 is responsible for the following:

- Inputs all of the read data interface signals from the slave peripheral;
- Decodes rmstid to select the correct master that the data is to be returned to;
- Decodes repriority to create a set of one-hot 8-bit wide request buses that connect to the read data arbiters of each master that can address this slave;
- Multiplexes the rready signals from each of the read data arbiters and outputs the result to the attached slave peripheral.

A write status decoder in each slave write status interface 908 is responsible for the following:

- Inputs all of the write status interface signals from the slave peripheral
- Decodes smstid to select the correct master that the status is to be returned to.
- Multiplexes the sready signals from each of the write status arbiters and outputs the result to the attached slave peripheral.

In addition to all of the blocks that are required for each master and slave peripheral there is one additional block that is required for garbage collection within the SCR, null slave 909. Since VBUSM is a split protocol, all transactions must be completely terminated in order for exceptions to be handled properly. In the case where a transaction addresses a non-existent/reserved memory region (as determined by the address map that each master sees) this transaction is routed by the command decoder to the null slave endpoint 909. The null slave functions as a simple slave whose primary job is to gracefully accept commands and write data and to return read data and write status in order to complete the transactions. All write transactions that the null slave endpoint receives are completed by tossing the write data and by signaling an addressing error on the write status interface. All read transactions that are received by the null endpoint are completed by returning all zeroes read data in addition to an addressing error.

Figure 10:
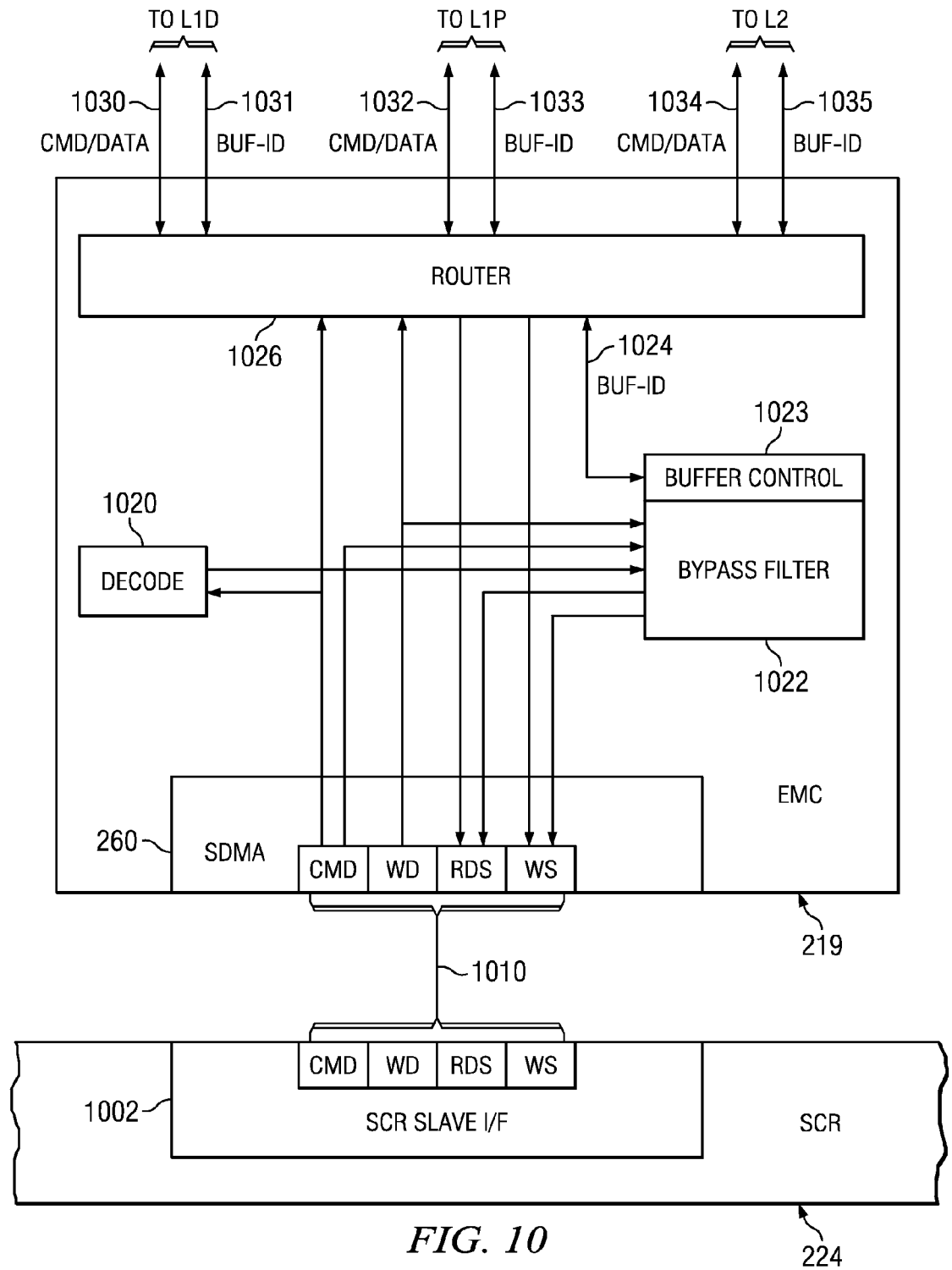
FIG. 10 is a block diagram of an external memory controller with a status bypass buffer.

FIG. 10 is a block diagram an external memory controller (EMC) 219 with an information bypass buffer 1022. EMC 219 is located within each core 110, as illustrated in FIG. 2. As was discussed above, according to protocol used for transactions on the packet based switch fabric 224, control information such as command ID and master ID are sent along with a command from an external master. This and additional information such as status and byte enables, which indicate valid bytes of data, are to be returned back to the external master. This information needs to be pipelined throughout the path of the transaction so that the it can correctly routed to the slave and then back to correct master.

When an external access reach the boundary of core module 110, router 1026 routes the access requests to L1D, L1P or L2 using command/data links 1030, 1032, and 1034 respectively based on a global address provided by the transaction command. Control data not absolutely needed by these destinations may be stored in bypass buffer 1022 and may then be appended and routed back with return data to the external master to follow protocol.

As each external access request is sent to core 110, the control information that is not needed for the local access request is stored in a memory location in bypass buffer 1022, which may be a small register file or memory. The address of this memory location is sent as a buffer ID 1024 to the selected endpoint L1D, L1P or L2 on respective BUF-ID signal 1031, 1033, 1035 along with the command and data. When each access request is completed, the target endpoint also returns this unique buffer ID along with the response for the request. Bypass buffer control logic 1023 then looks up the memory location associated with this command ID, appends the command/status information stored therein with the return data when sending the transaction reply back to the external master. The look-up mechanism for the control information in bypass buffer 1022 may be a simple two dimensional array/memory access where the buffer ID serves as the address, for example.

In this manner, command/data links 1030, 1032, 1034 may each require fewer signal lines which saves routing space on the substrate of SoC 100 and reduces power consumption by reducing the number of signals in each command/data link and access pipeline that need to driven. For example, in this embodiment, each L1D, L1P or L2 end point is accessed via a separate pipeline that each may have a pipeline depth of eight stages, for example. Thus, (8×3)×(number of control bits bypassed) bits of pipeline stage storage that would be needed for storing this information in the pipeline and routing it back for the reply are eliminated. Instead, in this embodiment with eight pipeline stages in each access pipeline, only (8×3)×(number of buffer ID bits) bits of storage in the access pipelines is needed for storing the buffer ID information. If the bypass buffer has 16 entries, for example, then the buffer ID may be four bits.

In this embodiment, the SCR 224 and slave interface 1002 operate at a lower clock frequency than the processor and memory resources L1D, L1P and L2. Therefore, bypass buffer 1022 may operate at the slower clock frequency of SCR interface 1002, which is ⅓ the clock rate of the processor and memories. This relaxation in timing for the bypass buffer will help reduce power as higher Vt cells may be used to meet the relaxed timing requirement.

Figure 11:
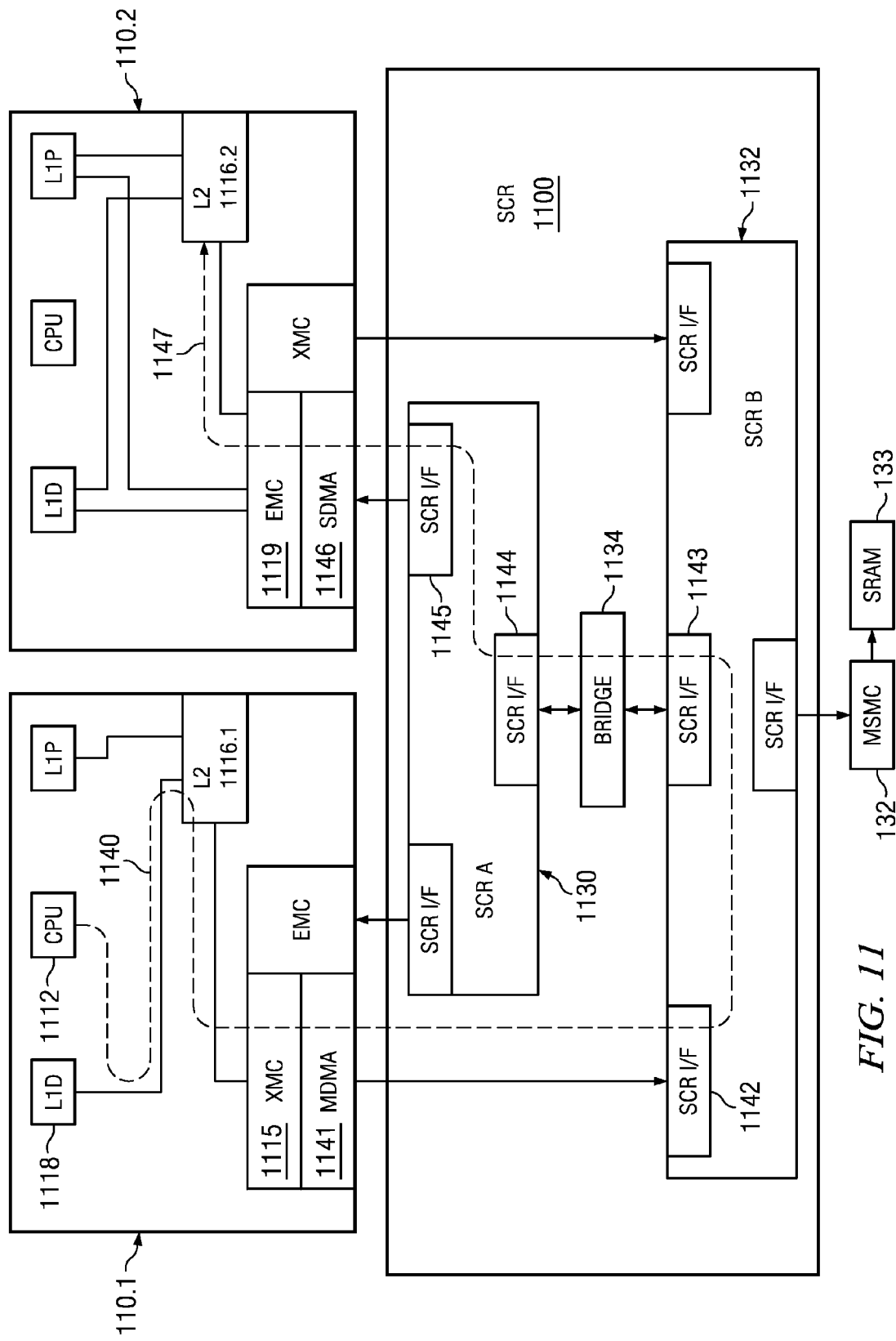
FIG. 11 is a block diagram illustrating flow of a transaction between two processor modules in the SoC of FIG. 1.

FIG. 11 is a block diagram illustrating flow of a transaction between two processor modules in the SoC of FIG. 1. While only two core modules 110.1, 110.2 are illustrated, embodiments of SoC 100 may contain more than two cores, such as four, eight or more. In this embodiment, there are two interconnected switch fabrics SCR-A 1130 and SCR-B 1132 that are connected by a bridge 1134. Each core 110.1, 110.2 is coupled to SCR-A 1130 using a slave interface coupled to the SDMA interface in the EMC of each core. Each core has an MDMA interface in the XMC coupled to a master interface in SCR-B 1132.

An example transaction 1140 may be initiated by CPU 1112 in core 110.1 to a memory address that is actually assigned to a memory location in the shared memory of L2 cache 1116.2 in the core 110.2. The transaction is first routed to L1D 1118. If the requested data is not in L1D cache 1118, then the transaction request is routed to L2 cache 1116.1. If the requested data is not in L2 cache 1116.1, then the transaction request is routed to XMC 1115 to make an external request to core 110.2, based on the address of the transaction request. MDMA interface 1141 then launches a request into SCR-B 1132 via master SCR interface 1142. Based on address decoding, the transaction is routed to slave SCR interface 1143 and then to bridge 1134 and thereby to SCR-A 1130 via master SCR interface 1144. SCR-A 1130 then routes the transaction request to slave SCR interface 1145 and thereby to SDMA interface 1146 that is part of EMC 1119 in core 110.2.

Routing logic within EMC 1119 then routes a modified request 1147 to shared SRAM within L2 cache 1116.2 after stripping off control and status information that is not needed for a local request. As was described in more detail above, a large amount of command and status information may be required by the protocol used to control the SCR that is not needed for an internal access within the core. This locally unneeded information may be stored in a bypass buffer as described in more detail with regard to FIG. 10. A buffer ID is then included in the modified request 1147 that is sent to L2 SRAM 1116.2.

This modified request may then go through an arbitration process with other requests from the L1D and L1P cache in core 110.2. Once the modified transaction is given access to shared SRAM 1116.2, read data and status is then provided to EMC 1119 along with the buffer ID value for that request if the request was for a read. If the request was a write, then completion status and the buffer ID is provided to EMC 1119. As described in more detail with regard to FIG. 10, the buffer ID value is then used to access the bypass buffer in EMC 1119 and the stored command and status information is appended to the reply information. Some of the information that was stored in the bypass buffer may then be used to correctly route the transaction response data/status back through the switch fabric to core 110.1 where it is finally loaded into L1D cache 1118 and provided to CPU 1112.

Figure 12:
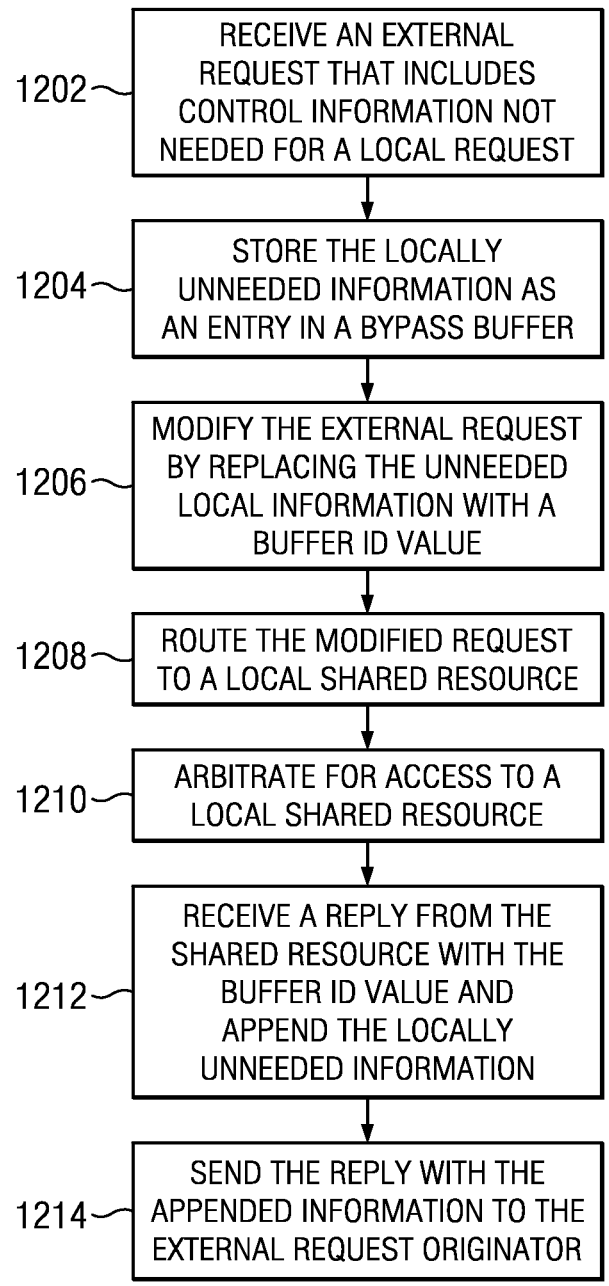
FIG. 12 is a flow diagram illustrating operation of bypass buffering.

FIG. 12 is a flow diagram illustrating operation of bypass buffering while accessing a shared resource comprised within a module. An external transaction request is received 1202 from an external requester outside the module for access to the shared resource within the module. The external transaction request may include control information that may be part of a protocol used on an interconnect that transported the external transaction, for example. The external request may include byte enable signals that need to be returned to the originating requester. The external request may include permission or other security type information. The external request may include routing information such as an originating requester identification field or other type of return address field, a command identification field, priority information, etc.

A portion of the control information may not be needed to access the internal shared resource, but must be retained for use in returning a reply to the originating requester, and may be stored 1204 as an entry in a multi-entry bypass buffer. The external transaction request may be modified 1206 to form a modified request by replacing the portion of control information with an identification value indicative of the entry location in the multi-entry bypass buffer.

The modified request and identification value may then be routed 1208 to access the shared resource. After the shared resource is accessed, a reply to the modified request is received 1212 from the memory subsystem that includes the identification value. The reply is modified 1212 by replacing the identification value with the stored portion of control information from an entry in the multi-entry buffer indicated by the identification value. The modified reply is then sent 1214 to the external requester.

In many embodiments, an arbitration contest may be performed 1210 for access to the shared resource between the modified request and a local request generated by a requester within the module.

System Example

Figure 13:
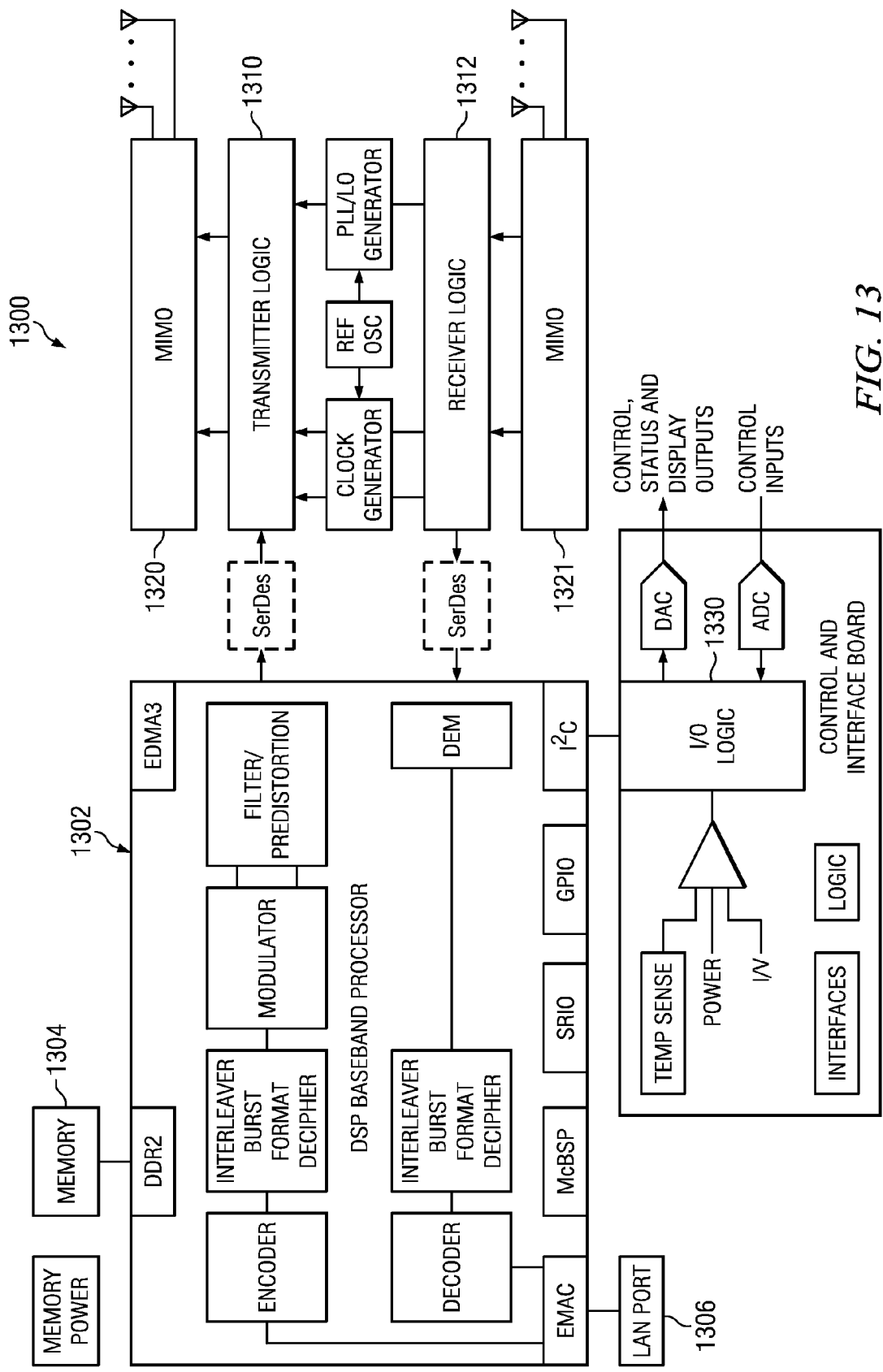
FIG. 13 is a block diagram of a system that includes the SoC of FIG. 1.

FIG. 13 is a block diagram of a base station for use in a radio network, such as a cell phone network. SoC 1302 is similar to the SoC of FIG. 1 and is coupled to external memory 1304 that may be used, in addition to the internal memory within SoC 1302, to store application programs and data being processed by SoC 1302. Transmitter logic 1310 performs digital to analog conversion of digital data streams transferred by the external DMA (EDMA3) controller and then performs modulation of a carrier signal from a phase locked loop generator (PLL). The modulated carrier is then coupled to multiple output antenna array 1320. Receiver logic 1312 receives radio signals from multiple input antenna array 1321, amplifies them in a low noise amplifier and then converts them to digital a stream of data that is transferred to SoC 1302 under control of external DMA EDMA3. There may be multiple copies of transmitter logic 1310 and receiver logic 1312 to support multiple antennas.

The Ethernet media access controller (EMAC) module in SoC 1302 is coupled to a local area network port 1306 which supplies data for transmission and transports received data to other systems that may be coupled to the internet.

An application program executed on one or more of the processor modules within SoC 1302 encodes data received from the internet, interleaves it, modulates it and then filters and pre-distorts it to match the characteristics of the transmitter logic 1310. Another application program executed on one or more of the processor modules within SoC 1302 demodulates the digitized radio signal received from receiver logic 1312, deciphers burst formats, and decodes the resulting digital data stream and then directs the recovered digital data stream to the internet via the EMAC internet interface. The details of digital transmission and reception are well known.

By using a status buffer in each core to reduce routing overhead, performance of each core may be improved and data can be shared among the multiple cores within SoC 1302 such that data drops are avoided while transferring the time critical transmission data to and from the transmitter and receiver logic.

Input/output logic 1330 may be coupled to SoC 1302 via the inter-integrated circuit (I2C) interface to provide control, status, and display outputs to a user interface and to receive control inputs from the user interface. The user interface may include a human readable media such as a display screen, indicator lights, etc. It may include input devices such as a keyboard, pointing device, etc.

Other Embodiments

Although the invention finds particular application to Digital Signal Processors (DSPs), implemented, for example, in a System on a Chip (SoC), it also finds application to other forms of processors. A SoC may contain one or more megacells or modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, in another embodiment, a different interconnect topology may be embodied. Each topology will need to be analyzed to determine what command and status information is needed. Once determined, a portion of the command and status information not needed for a local access may be temporarily stored in a buffer and then appended to a return packet for each completed transaction, as described herein.

In another embodiment, rather than routing the buffer ID information with the modified external request, a scoreboard may be created to track each modified external request that is active within the module. As each one is completed, the scoreboard may be consulted to determine the location of the stored locally unneeded control information in the bypass buffer.

In another embodiment, the bypass buffer may be implemented as a circular buffer that circulates the locally unneeded information. As each reply is received, the corresponding information may be removed from the circle. In another embodiment, the bypass buffer may be implemented as a first in first out (FIFO) type buffer.

In another embodiment, the shared resource may be just a memory that is not part of a cache. The shared resource may by any type of storage device or functional device that may be accessed by multiple masters in which only a portion of interconnect protocol information is needed to perform a local access to the shared resource.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method of accessing a shared resource comprised within a module, the method comprising:
   receiving an external transaction request from an external requester outside the module for access to the shared resource within the module, wherein the external transaction request includes control information;
   modifying the external transaction request to form a modified request by removing a portion of the control information;
   storing the removed portion of the control information as an entry in a bypass buffer;
   further modifying the modified external transaction request by attaching an indicative value corresponding to the entry within the bypass buffer where the corresponding removed portion of control information is stored;
   supplying the further modified external transaction request to the shared resource;
   receiving a reply to the further modified request from the shared resource;
   modifying the reply by appending the corresponding stored portion of control information from the entry in the bypass buffer; and
   sending the modified reply to the external requester.

2. The method of claim 1, wherein the shared resource is a multi-level cache memory.

3. The method of claim 1, wherein the external transaction request is a read request and the reply includes read data and the control information.

4. The method of claim 1, wherein the external transaction request is a write request and the reply includes the control information.

5. The method of claim 1, wherein the control information comprises routing information.

6. The method of claim 5, wherein the control information further comprises byte enable information.

7. The method of claim 1, further comprising arbitrating for access to the shared resource between the modified request and a local request generated by a requester within the module.

8. A system comprising a module, the module comprising:
   a shared resource configured for access by a requester that is external to the module;
   interface logic coupled to the shared resource, the interface logic configured to receive an access request for the shared resource from an external requester;
   a bypass buffer coupled to the interface logic, wherein the bypass buffer is configured to store a portion of information removed from an access request received from the external requester at a location in the buffer indicated by a buffer ID value; and
   control logic coupled to the bypass buffer, the control logic configured to
   append the corresponding buffer ID value to the access request,
   supply the access request with the corresponding buffer ID value to the shared resource,
   receive an access request response from the shared resource including the corresponding buffer ID value,
   append the corresponding portion of information from the bypass buffer to the access request response received from the shared resource, and
   supply the access request response with the corresponding portion of information from the bypass buffer to the external requester.

9. The system of claim 8, further comprising:
   a local requester located within the module coupled to access the shared resource; and
   arbitration logic coupled to the shared resource, the arbitration logic configured to provide arbitration between a request from the local requester and a request from the external requester.

10. The system of claim 8, wherein the shared resource is a multi-level cache memory.

11. The system of claim 10 being formed within a single integrated circuit, further comprising a plurality of the modules interconnected by a switch fabric.

12. A system on a chip comprising:
a shared resource within a module;
means for receiving an external transaction request from an external requester outside the module for access to the shared resource within the module, wherein the external transaction request includes control information;
means for modifying the external transaction request to form a modified request by removing a portion of the control information;
means for storing the removed portion of the control information as an entry in a bypass buffer;
means for further modifying the modified external transaction request by attaching an indicative value corresponding to the entry within the bypass buffer where the corresponding removed portion of control information is stored;
means for supplying the further modified external transaction request to the shared resource;
means for receiving a reply to the further modified request from the shared resource,
means for modifying the reply by appending the corresponding stored portion of control information from the entry in the bypass buffer; and
means for sending the modified reply to the external requester.

13. The method of claim 1, wherein:
a number of bits in the indicative value is less than a number of bits in the corresponding portion of the control information.

14. The method of claim 1, wherein:
the portion of the control information consists of information not needed for access to the shared resource.

15. The system of claim 8, wherein:
a number of bits in the buffer ID value is less than a number of bits in the corresponding portion of the control information.

16. The system of claim 8, wherein:
the portion of the control information consists of information not needed for access to the shared resource.

17. The system of claim 8, wherein:
the external transaction request is a read request and the response includes read data and the control information.

18. The system of claim 8, wherein:
the access request from the external requester is a write request and the reply includes the control information.

19. The system of claim 8, wherein:
the control information comprises routing information.

20. The system of claim 19, wherein:
the control information further comprises byte enable information.

21. The system of claim 12, wherein:
the shared resource is a multi-level cache memory.

22. The system of claim 12, wherein:
a number of bits in the indicative value is less than a number of bits in the corresponding portion of the control information.

23. The system of claim 12, wherein:
the portion of the control information consists of information not needed for access to the shared resource.

24. The system of claim 12, wherein:
the external transaction request is a read request and the response includes read data and the control information.

25. The system of claim 12, wherein:
the access request from the external requester is a write request and the reply includes the control information.

26. The system of claim 12, wherein:
the control information comprises routing information.

27. The system of claim 26, wherein:
the control information further comprises byte enable information.

28. The system of claim 12, further comprising:
a local requester configured to access the shared resource by a local request; and
an aribiter connected to the means for receiving an external transaction request and the local requester configured to arbitrate for access to the shared resource between the modified external transaction request and the local request.

* * * * *